United States Patent
Bedell et al.

(10) Patent No.: US 7,169,226 B2
(45) Date of Patent: *Jan. 30, 2007

(54) DEFECT REDUCTION BY OXIDATION OF SILICON

(75) Inventors: Stephen W. Bedell, Wappingers Falls, NY (US); Huajie Chen, Wappingers Falls, NY (US); Anthony G. Domenicucci, New Paltz, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 479 days.

This patent is subject to a terminal disclaimer.

(21) Appl. No.: 10/610,612

(22) Filed: Jul. 1, 2003

(65) Prior Publication Data

US 2005/0003229 A1    Jan. 6, 2005

(51) Int. Cl.
*C30B 13/00*    (2006.01)
*H01L 21/20*    (2006.01)

(52) U.S. Cl. .............. 117/43; 117/4; 117/89; 438/311; 438/341; 438/478; 438/479; 438/933

(58) Field of Classification Search ............ 117/43, 117/4, 89; 438/479, 311, 341, 478, 933
See application file for complete search history.

(56) References Cited

U.S. PATENT DOCUMENTS

| | | | |
|---|---|---|---|
| 6,841,457 B2 * | 1/2005 | Bedell et al. .............. 438/479 |
| 6,846,727 B2 * | 1/2005 | Fogel et al. .............. 438/479 |
| 6,989,058 B2 * | 1/2006 | Bedell et al. .............. 117/4 |
| 6,992,025 B2 * | 1/2006 | Maa et al. .............. 438/795 |
| 7,026,249 B2 * | 4/2006 | Bedell et al. .............. 438/706 |
| 2005/0130424 A1 * | 6/2005 | Bedell et al. .............. 438/689 |

* cited by examiner

*Primary Examiner*—Yogendra Gupta
*Assistant Examiner*—G. Nagesh Rao
(74) *Attorney, Agent, or Firm*—Scully, Scott, Murphy & Presser, P.C.; Robert M. Trepp, Esq.

(57) ABSTRACT

A method of fabricating high-quality, substantially relaxed SiGe-on-insulator substrate materials which may be used as a template for strained Si is described. A silicon-on-insulator substrate with a very thin top Si layer is used as a template for compressively strained SiGe growth. Upon relaxation of the SiGe layer at a sufficient temperature, the nature of the dislocation motion is such that the strain-relieving defects move downward into the thin Si layer when the buried oxide behaves semi-viscously. The thin Si layer is consumed by oxidation of the buried oxide/thin Si interface. This can be accomplished by using internal oxidation at high temperatures. In this way the role of the original thin Si layer is to act as a sacrificial defect sink during relaxation of the SiGe alloy that can later be consumed using internal oxidation.

22 Claims, 5 Drawing Sheets

DEFECT REDUCTION BY OXIDATION OF SILICON

RELATED APPLICATIONS

This application is related to co-pending and co-assigned U.S. patent application Ser. No. 10/055,138, filed Jan. 23, 2002, entitled "Method of Creating High-Quality Relaxed SiGe-On-Insulator for Strained Si CMOS Applications", as well as co-pending and co-assigned U.S. patent application Ser. No. 10/196,611, filed Jul. 16, 2002, entitled "Use Of Hydrogen Implantation To Improve Material Properties Of Silicon-Germanium-On-Insulator Material Made By Thermal Diffusion", the entire contents of each of which are incorporated herein by reference.

FIELD OF THE INVENTION

The present invention relates to a method of fabricating a semiconductor substrate material, and more particularly to a method of fabricating a high-quality, substantially relaxed SiGe-on-insulator (SGOI) substrate material. The high-quality, substantially relaxed SiGe-on-insulator substrate material of the present invention can be used as a lattice mismatched template for creating a strained Si layer thereon by subsequent Si epitaxial overgrowth. Such a substrate material is desired for the enhanced charge carrier transport properties within a strained Si layer and is a candidate for future high performance complementary metal oxide semiconductor (CMOS) applications. The present invention is also directed to a SiGe-on-insulator substrate material as well as structures which include at least the substrate material.

BACKGROUND OF THE INVENTION

Macroscopic, continuous layers of strained crystalline materials tend to relax plastically upon heating to a high enough temperature provided the total strain energy exceeds a critical value. Plastic relaxation refers to a mechanism whereby crystalline defects are introduced into the strained layer, which serve to reduce the total strain within the film. These crystalline defects themselves, require energy to form and thus only do so when the total strain energy within the layer is greater than the formation energy of the strain-relieving defect. This criterion is what defines the critical strain value of a system. The critical strain value is dependent on the type of defects formed and the mechanical properties of the crystal.

In the case of compressively strained SiGe layers grown on a Si template, the predominate type of strain-relieving defect formed is a misfit dislocation. Misfit dislocations move through the crystal after forming in a manner that is dictated by the nature of the stress tensor at the instantaneous position of the dislocation. For strained SiGe layers grown on a Si substrate; where the Si thickness is many times that of the SiGe layer, the dislocations glide upwards through the SiGe layer. If the Si substrate is thinner than the SiGe layer, the nature of the forces acting on the dislocations is such that the dislocations will glide downward onto the Si layer. The latter phenomenon is described in an article by Y. H. Lo entitled "New approach to grow pseudomorphic structures over the critical thickness", Appl. Phys. Lett., Vol. 59, No. 18, October 1991, pp. 2311–2313.

Use of silicon-on-insulator (SOI) substrates with a thin Si layer above a buried oxide layer were considered for making relaxed SiGe layers with low-defect density by forcing the defects to be driven into the underlying thin Si layer. For this phenomenon to occur, the buried oxide layer had to behave viscously so that the Si layer would act like a free layer. The problem with this prior art approach is that a highly defective top SiGe layer is exchanged for a highly defective underlying Si layer, and neither scenario is acceptable for use with modern complementary metal oxide semiconductor (CMOS) applications.

In view of the prior art mentioned above, there is a need for providing a new and improved method in which a high-quality, substantially relaxed SiGe layer can be formed atop an SOI substrate whereby the highly defective underlying Si layer is eradicated after it serves as a defect sink for producing the substantially relaxed SiGe layer.

SUMMARY OF THE INVENTION

One object of the present invention is to provide a method of fabricating thin, high-quality, substantially relaxed SiGe-on-insulator substrate materials using an SOI substrate as a template.

Another object of the present invention is to provide a method of fabricating thin, high-quality, substantially relaxed SiGe-on-insulator substrate materials in which the thin top Si layer of an SOI substrate is used as a defect sink during the formation of the substantially relaxed SiGe layer.

A further object of the present invention is to provide a method of fabricating thin, high-quality, substantially relaxed SiGe-on-insulator substrate materials in which the thin top Si layer of an SOI substrate is consumed after or during the relaxation of the SiGe layer by internal oxidation.

A yet further object of the present invention is to provide a method of fabricating thin, high-quality, low-defect density, substantially relaxed SiGe-on-insulator substrate materials, which is compatible with CMOS processing steps.

An even further object of the present invention is to provide a method of fabricating thin, high-quality, low-defect density, substantially relaxed SiGe-on-insulator substrate materials which can be used as lattice mismatched templates, i.e., substrates, for forming strained Si layers.

A still further object of the present invention is to provide strained Si/substantially relaxed SiGe-on-insulator structures that have high charge carrier mobility and are useful in high-performance CMOS applications.

These and other objects and advantages are achieved in the present invention by utilizing a method in which a sacrificial layer of an SOI substrate, i.e., the thin top Si layer, which serves as a defect sink during relaxation of the SiGe layer, is consumed by internal oxidation. In accordance with the present invention, the method begins with forming a Ge-containing layer on a surface of a sacrificial single crystal Si layer that is present atop a barrier layer that is resistant to Ge diffusion. After forming such a structure, the structure is then subjected to an annealing and oxidation process at a temperature that (i) homogenizes Ge atoms throughout the sacrificial layer and the Ge-containing layer, (ii) relaxes the Ge-containing layer by creating dislocations that are injected predominately into the sacrificial single crystal Si layer, and (ii) consumes the sacrificial single crystal single layer by internal oxidation.

A substantially relaxed, single crystal layer is thus formed during the oxidation step that is comprised of a homogeneous mixture of the Ge-containing layer and the sacrificial layer. Moreover, during the oxidation a thermal oxide layer forms above the barrier layer by consumption of the sacrificial layer.

The technique of using a thin sacrificial crystalline film as a defect sink for relaxing lattice-mismatched crystalline layers followed by consumption of the sacrificial layer by internal oxidation (ITOX) can be combined with any number of schemes designed to either enhance the role of the thin sacrificial layer as an effective defect sink or to enhance the relaxation of the strained lattice-mismatched overlayer.

Following the steps of the present invention, a strained Si layer may be grown epitaxially atop the substantially relaxed single crystal SiGe layer to form a strained Si/relaxed SiGe-containing heterostructure that can be used in a variety of high-performance CMOS applications.

In accordance with the present invention, the sacrificial single crystal Si and barrier layer are components of a silicon-on-insulator (SOI) substrate. The present method also contemplates the use of barrier layers that are unpatterned (i.e., barrier layers that are continuous) or patterned (i.e., discrete and isolated barrier regions or islands which are surrounded by semiconductor material).

In yet another embodiment of the present invention, a Si cap layer is formed atop the Ge-containing layer prior to oxidation. This embodiment of the present invention alters the thermodynamic stability (in terms of preventing defect production) of the strained SiGe layer before annealing and oxidation. The SiGe layer has a thickness of about 2000 nm or less, with a thickness of from about 10 to about 200 nm being more highly preferred.

In still yet another embodiment of the present invention, an ion implantation step may be performed prior to oxidation. In a further embodiment of the present invention, the sacrificial single crystal Si layer is amorphized, either partially or completely, prior to oxidation.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate, wherein an upper region of the insulating region is a thermal oxide; and a substantially relaxed SiGe layer present atop the insulating region, wherein the substantially relaxed SiGe layer has a thickness of about 2000 nm or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate, wherein an upper region of the insulating region is a thermal oxide; a substantially relaxed SiGe layer present atop the insulating region, wherein the substantially relaxed SiGe layer has a thickness of about 2000 nm or less; and a strained Si layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
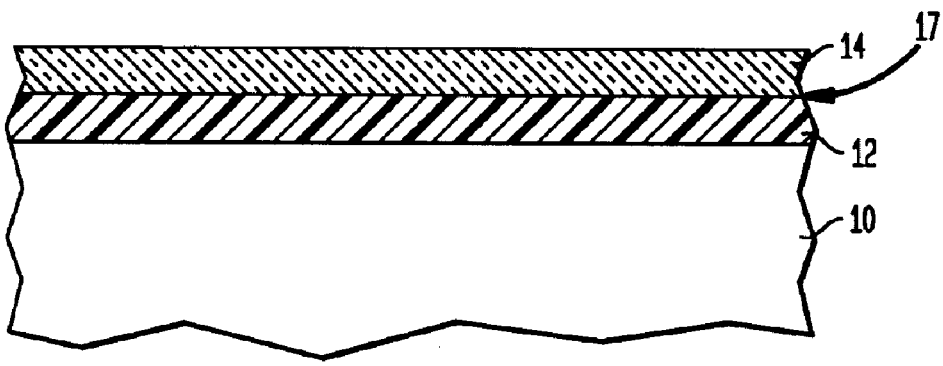
FIGS. 1A–1E are pictorial representations (through cross-sectional views) showing the basic processing steps that are employed in the present invention in fabricating a thin, high-quality, substantially relaxed SiGe-on-insulator substrate material wherein the initial substrate includes an unpatterned diffusion barrier region.

The present invention, which provides a method of fabricating thin, high-quality, substantially relaxed SiGe-on-insulator substrate materials which can then serve as a lattice mismatched template for subsequent overgrowth of epitaxial Si, will now be described in greater detail by referring to the drawings that accompany the present application. In the accompanying drawings, like and/or corresponding elements are referred to by like reference numerals.

The present application provides a method for creating a high-quality, substantially relaxed SiGe-on-insulator substrate material by consumption of a sacrificial layer that has served as a defect sink. In the present method, the sacrificial layer, which is the top Si layer of an SOI substrate, is thin and the Ge-containing layer is thick thereby relaxation of the SiGe layer takes place by plastic deformation of the underlying, thin sacrificial layer. The thin sacrificial layer gets consumed in a unique way. Oxidation of Si and SiGe surfaces generally takes place at a semiconductor/oxide interface. Specifically, oxygen diffuses through the surface oxide and reacts with Si at the first semiconductor/oxide interface.

At very high oxidation temperatures, as is the case in the present invention, the combination of higher O solubility within the semiconductor and higher diffusitivity allow a fraction of the diffusing O to penetrate below the first semiconductor/oxide interface. This O subsequently reacts with the buried barrier layer-semiconductor interface resulting in an upward growth of a thermal oxide layer. This growth efficiently consumes the semiconductor material at the barrier layer/semiconductor interface. This process, which is referred to herein as internal oxidation (ITOX), is used to consume the thin sacrificial Si layer which previously served as the defect sink during relaxation of the SiGe layer.

Figure 2A:
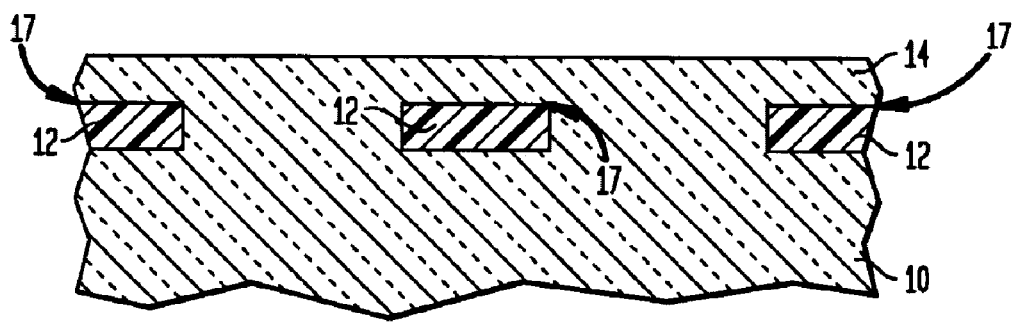
FIGS. 2A–2E are pictorial representations (through cross-sectional views) showing the basic processing steps that are employed in an alternative embodiment of the present invention in fabricating a thin, high-quality, substantially relaxed SiGe-on-insulator substrate material wherein the initial substrate includes a patterned diffusion barrier region.

Reference is first made to FIGS. 1A and 2A, which show initial substrate materials that can be employed in the present invention. Specifically, the initial substrate materials illustrated in FIGS. 1A and 2A each comprise a Si-containing semiconductor substrate 10, a barrier layer 12 which is resistant to Ge diffusion (hereinafter "barrier layer") present atop a surface of the Si-containing semiconductor substrate 10 and a sacrificial single crystal Si layer 14 present atop the barrier layer 12. In the drawings, reference numeral 17 denotes the interface between the barrier layer 12 and the sacrificial single crystal Si layer 14. In the present invention, ITOX will initiate at the interface 17.

The difference between the two initial structures depicted in the drawings is that, in FIG. 1A, the barrier layer 12 is present continuously throughout the entire structure, whereas in FIG. 2A, the barrier layer 12 is present as discrete and isolated regions or islands that are surrounded by semiconductor material, i.e., layers 10 and 14. The initial structure shown in FIG. 1A includes an unpatterned barrier layer, whereas the initial structure of FIG. 2A includes a patterned barrier layer.

Notwithstanding whether the barrier layer 12 is patterned or unpatterned, the initial structure may be a conventional silicon-on-insulator (SOI) substrate material wherein region 12 is a buried oxide region which electrically isolates the sacrificial single crystal Si layer 14 from the Si-containing substrate semiconductor substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, or preformed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well known to those skilled in the art, as well as the various SIMOX processes mentioned in co-assigned U.S. patent applications Ser. No. 09/861,593; filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate the patterned substrate shown in FIG. 2A. Alternatively, the 901 substrate material may be made using other conventional processes including, for example, a thermal bonding and layer transfer process.

In addition to SOI substrates, the initial substrates shown in FIGS. 1A and 2A may be an SOI-like substrate that is made using conventional deposition processes as well as lithography and etching (employed when fabricating a patterned substrate). Specifically, when SOI-like substrates are employed, the initial structure is formed by depositing a Ge diffusion barrier layer atop a surface of a Si-containing substrate, via conventional deposition or thermal growing processes; optionally patterning the barrier layer by employing conventional lithography and etching; and thereafter forming a single crystal Si layer atop the barrier layer using conventional deposition processes including, for example, chemical vapor deposition (CVD), plasma-assisted CVD, sputtering, evaporation, chemical solution deposition or epitaxial Si growth.

Barrier layer 12 of the initial structure shown in FIGS. 1A and 2A comprises any insulating material that is highly resistant to Ge diffusion. Examples of such insulating and Ge diffusion resistant materials include, but are not limited to: crystalline or non-crystalline oxides or nitrides. Typically, the barrier layer 12 is a buried oxide layer.

The thickness of the various layers of the initial structure may vary depending on the process used in making the same. Typically, however, sacrificial single crystal Si layer 14 is a thin layer that has a thickness of from about 1 to about 50 nm, with a thickness of from about 5 to about 30 nm being more highly preferred. In the case of the barrier layer 12 (i.e., the Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention. The thicknesses provided above are exemplary and by no ways limit the scope of the present invention.

Figure 1B:
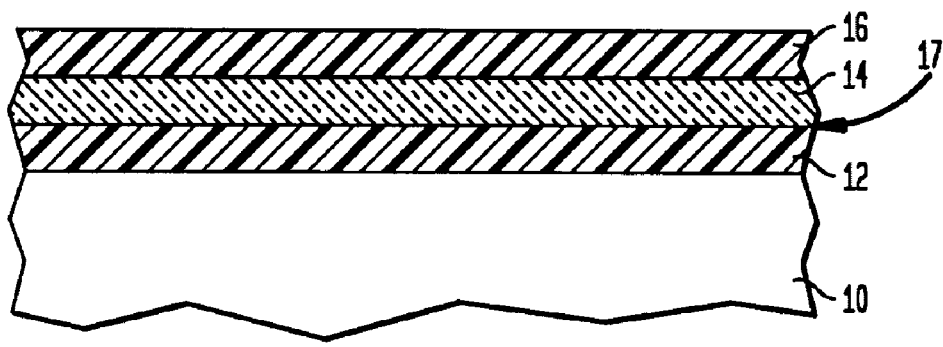
Figure 2B:
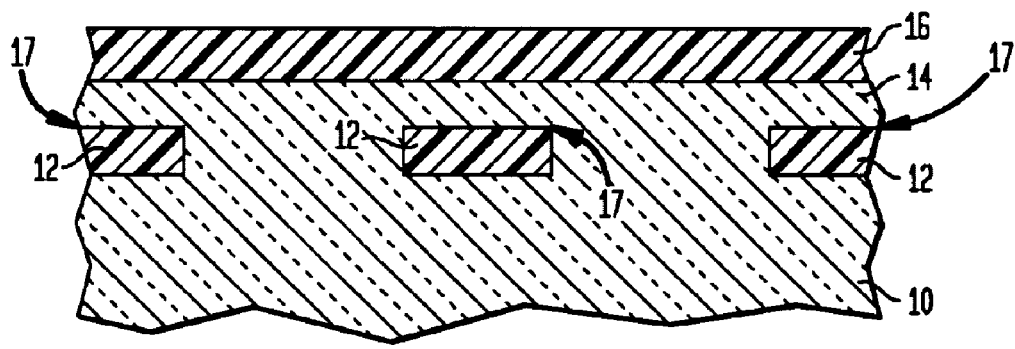

FIGS. 1B and 2B illustrate the structure that is formed after a Ge-containing layer 16 is formed atop the sacrificial single crystal Si layer 14. The Ge-containing layer 16 includes a SiGe alloy or pure Ge. The term "SiGe alloy" includes SiGe materials that comprise up to 99.99 atomic percent Ge, whereas pure Ge includes layers that comprise 100 atomic percent Ge. When SiGe layers are employed, it is preferred that the Ge content in the SiGe layer be from about 0.1 to about 99.9 atomic percent, with a Ge atomic percent of from about 10 to about 35 being even more highly preferred. The SiGe alloys may be amorphous or polycrystalline.

In accordance with the present invention, the Ge-containing layer 16 is formed atop the sacrificial single crystal Si layer 14 using any conventional epitaxial growth method that is well known to those skilled in the art which is capable of growing a Ge-containing layer that is strained, metastable as well as being substantially free from defects, i.e., misfit and TD dislocations. Illustrative examples of such epitaxial growing processes include, but are not limited to: Rapid thermal chemical vapor deposition (RTCVD), low-pressure chemical vapor deposition (LPCVD), ultra-high vacuum chemical vapor deposition (UHVCVD), atmospheric pressure chemical vapor deposition (APCVD), molecular beam (MBE) epitaxy or plasma-enhanced chemical vapor deposition (PECVD).

The thickness of the Ge-containing layer 16 formed at this point of the present invention may vary, but typically the Ge-containing layer 16 has a thickness that is greater than the underlying sacrificial single crystal Si layer 14. Generally, the Ge-containing layer 16 has a thickness of from about 10 to about 500 nm, with a thickness of from about 20 to about 200 nm being more highly preferred.

Figure 3A:
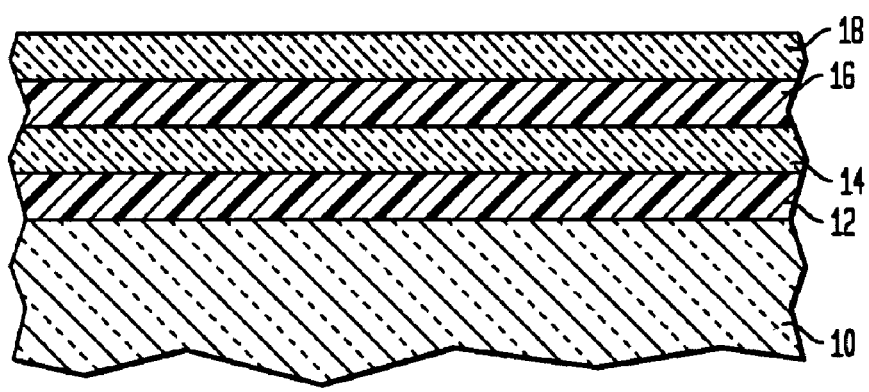
FIGS. 3A–3B are pictorial representations (through cross-sectional views) showing an alternative embodiment of the present invention wherein a Si cap layer is formed atop a Ge-containing layer which is formed on an unpatterned (3A) or patterned (3B) substrate.
Figure 3B:
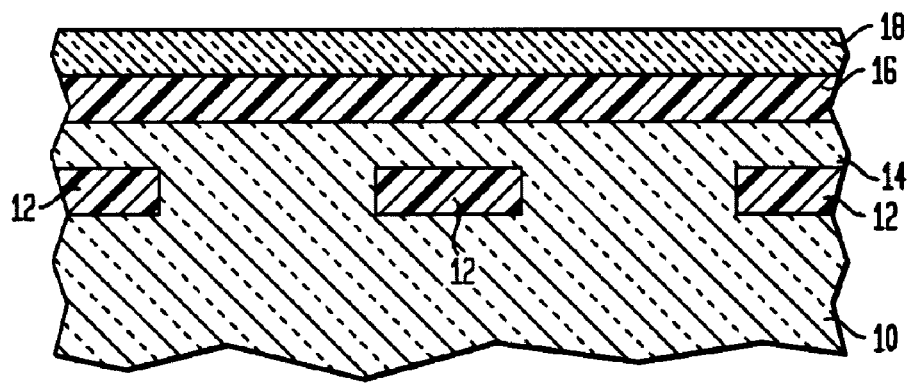

In an alternative embodiment of the present invention, see FIGS. 3A–3B, an optional cap layer 18 is formed atop the Ge-containing layer 16 prior to performing the oxidation step of the present invention. The optional cap layer 18 employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si. It is noted that layers 16 and 18 may, or may not, be formed in the same reaction chamber.

When present, the optional cap layer 18 has a thickness of from about 1 to about 100 nm, with a thickness of from about 1 to about 50 nm being more highly preferred. The optional cap layer 18 is formed utilizing any well-known deposition process including the epitaxial growth processes mentioned above.

In one embodiment of the present invention, it is preferred to form a Ge-containing layer (15 to 30 atomic percent Ge) having a thickness of from about 1 to about 200 nm on the surface of a single crystal Si layer, and thereafter forming a Si cap layer having a thickness of from about 1 to about 100 nm atop the Ge-containing layer.

After forming the Ge-containing layer 16 (with or without the optional cap layer 18) atop the initial structure, the structure shown in either FIGS. 1B or 2B (with or without the optional cap) may then be subjected to an optional ion implantation step wherein ions that are capable of forming defects that allow enhanced relaxation at or near the interface 17 is performed. Examples of such defects that permit enhanced relaxation to occur include: platelet defects or bubble-like defects, as in the case for hydrogen ion implantation. The implant may be performed with or without the use of an implantation mask.

Figure 1C:
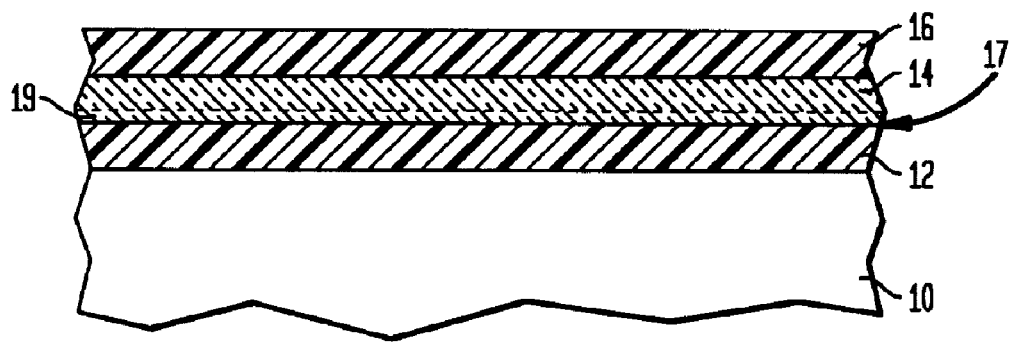
Figure 2C:
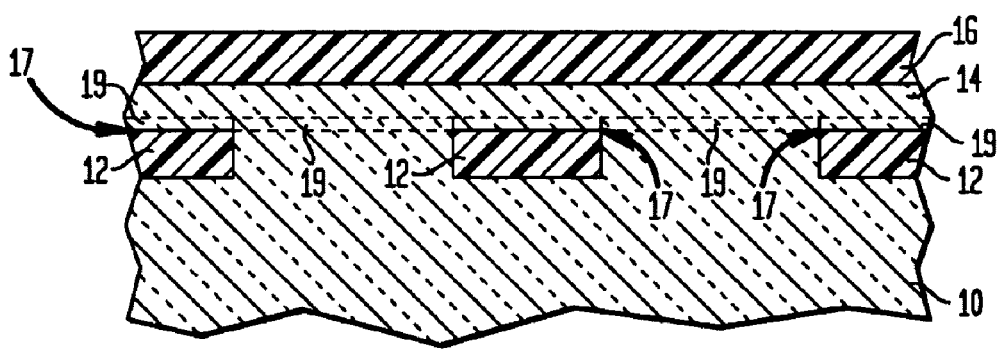

The structure that is formed after this implantation step is shown in FIGS. 1C or 2C. In these figures, reference numeral 19 denotes the defect regions formed by the ion implantation step. The defect regions solve the problem of defect production in the SiGe alloy/single crystal Si bilayer by allowing elastic relaxation of the SiGe layer to occur. Specifically, elastic relaxation occurs by plastically deforming the defect region that is present at or near the interface 17.

The defects, which permit enhanced relaxation to occur at or near the interface 17, are formed by implanting ions such as hydrogen, deuterium, helium, oxygen, neon, or mixtures thereof into the various layers using implant conditions which maintain the peak of the ion range at or near interface 17. Isotopes of the aforementioned ions are also contemplated herein. Preferred ions used in the present invention are hydrogen ions ($H^+$). It is noted that other species of hydrogen such as $H_2^+$ can also contemplated herein. The implant step of the present invention is conducted at approximately room temperature, i.e., a temperature of from about 283K to about 303K, using a beam current density of from about 0.01 to about 10 microamps/cm$^2$. Implantation at different temperatures and/or using other beam current densities may affect the relaxation behavior.

The concentration of the implant species used in forming the platelet defects may vary depending upon the type of implant species employed. Typically, however, the concentration of implanting ions used at this point of the present invention is below 3E16 cm$^{-2}$, with an ion concentration of from about 1E16 to about 2.99E16 cm$^{-2}$ being more highly preferred. The energy of this implant may also vary depending upon the type of ion that is being implanted, with the proviso that the implant energy must be capable of positioning ions at or near interface 17. For example, when hydrogen is employed as the implant ion, the energy used to ensure platelet formation at or near interface 17 is from about 1 to about 100 keV, with an energy of from about 3 to about 20 keV being more highly preferred.

The implantation of the foregoing energetic ions into or near the interface 17 creates defects that can serve as efficient dislocation nucleation sites which allow the SiGe layer to relax more efficiently. The randomness of the defect sites caused by this implantation also reduces defect pinning caused by interactions between moving dislocations and thereby makes the relaxation process more efficient. This ion implantation step can be used to make the relaxation process more efficient and can be combined with a subsequent high-temperature oxidation (i.e., ITOX) consumption of the sacrificial Si layer to enhance the final degree of relaxation of the SiGe layer.

In another embodiment of the present invention, the sacrificial single crystal Si layer 14 is amorphized, either completely or partially, by ion implantation wherein the peak of the damaged depth profile resulting from implantation is commensurate with the thin sacrificial single crystal Si layer 14. That is, the amorphization occurs by ion implanting the peak of the ion range within a range of ±1000 Å with respect to the center of the sacrificial single crystal Si layer 14. More preferably, the amorphization occurs by implanting the ion peak within ±500 Å of the center of the sacrificial single crystal Si layer 14. Amorphization ions such as Si, P, As or Ge can be used in the present invention. Any range of doses and energies that are sufficient to cause amorphization and to implant the ion peak within the ranges mentioned above may be used in the present invention. For example, if a 2000 Å $Si_{0.8}Ge_{0.2}$ layer is grown on a SOI substrate with a 200 Å (sacrificial) top Si layer, then a Si implant of about 130–150 keV at a dose of about 2–5×10$^{14}$ atoms/cm$^2$ could be used. The amorphization implantation also enhances the role of the sacrificial Si layer.

After forming the Ge-containing layer 16 (with or without the optional cap layer 18 and with or without the implant) atop the initial structure, the structure (with or without the optional cap layer 18 and with or without the implant) is then oxidized at a temperature which homogenizes Ge atoms throughout layers 14, 16 and, if present, 18; relaxes the strained Ge-containing layer 16 by creating dislocations that are predominately injected into the sacrificial single crystal Si layer 14; and consumes the sacrificial single crystal layer 14 by internal oxidation forming thermal oxide 25 above the initial barrier layer 12. During the oxidizing process the dislocation defects move downward into the sacrificial Si layer 14 thereby providing a defective material. This defective material, however, is consumed by ITOX.

Figure 1D:
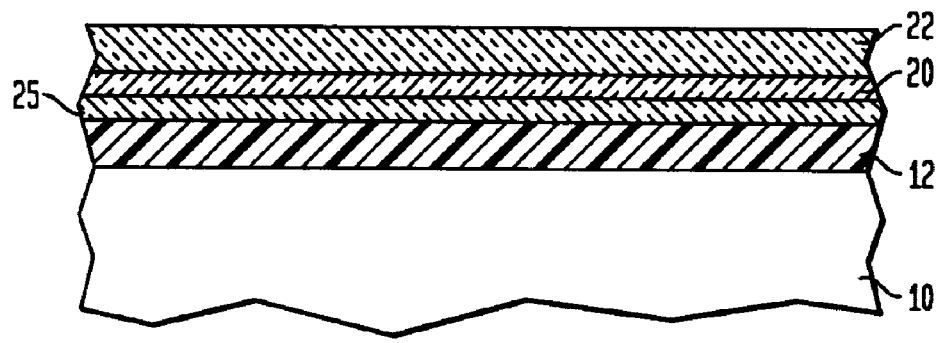
Figure 2D:
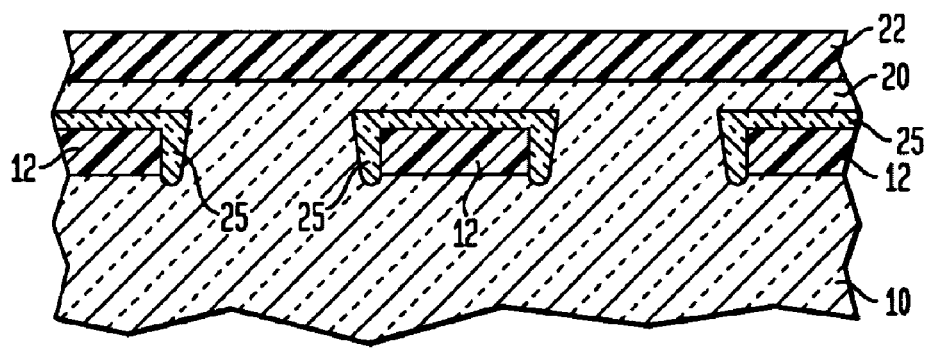

An oxide layer 22 is formed atop the SiGe layer 20 as well during the oxidation step. Oxide layer 22 is typically, but not always, removed from the structure after the heating step using a conventional wet etch process wherein a chemical etchant such as HF that has a high selectivity for removing oxide as compared to SiGe is employed. The resultant structure formed after the oxidation step has been performed is shown, for example in FIGS. 1D or 2D.

Note that when the oxide layer 22 is removed, a second sacrificial single crystal Si layer can be formed atop the SiGe layer 20 and the above processing steps of the present invention may be repeated any number of times to produce a multilayered relaxed SiGe substrate material.

The oxide layer 22 formed after the oxidation step of the present invention has a variable thickness which may range from about 10 to about 1000 nm, with a thickness of from about 20 to about 500 nm being more highly preferred. Insofar as the thermal oxide 25 resulting from internal oxidation is concerned, thermal oxide 25 has a variable thickness which may range from about 0.5 to about 100 nm, with a thickness of from about 1 to about 60 nm being more highly preferred. The thickness of thermal oxide 25 grown during oxidation at high temperatures (e.g., 1250° C.) is between 6 to 10% of the surface oxide thickness, but increases as the SGOI becomes thinner near the end of the oxidation step. The amount of thermal oxide 25 grown during oxidation is also dependent upon the oxidation temperature as well as the oxidation ambient. The thermal oxide 25 together with the barrier layer 12 form the insulating region of the substantially relaxed SiGe-on-insulator substrate material of the present invention. The insulating region thus contains an upper region that contains a thermal oxide.

Specifically, the oxidation step of the present invention is performed at a temperature of from about 1200° to about 1350° C., with a temperature of from about 1250° to about 1320° C. being more highly preferred. Moreover, the oxidation step of the present invention is carried out in an oxidizing ambient which includes at least one oxygen-containing gas such as $O_2$, NO, $N_2O$, ozone, air or other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The oxidation step may be carried out for a variable period of time which typically ranges from about 10 to about 1800 minutes, with a time period of from about 60 to about 600 minutes being more highly preferred. The oxidation may be carried out at a single targeted temperature, or various ramp and soak cycles using various ramp rates and soak times can be employed.

The oxidization is performed under an oxidizing ambient to achieve the presence of a surface oxide layer, i.e., layer 22, which acts as a diffusion barrier to Ge atoms as well forming the thermal oxide layer 25 in the structure by consumption of sacrificial single crystal layer 14. Once the oxide layer 22 is formed on the surface of the structure, Ge becomes trapped between the barrier layer 12 and the oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this oxidation step, the relative Ge fraction increases.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

After this oxidation step has been performed, the structure includes a uniform and substantially relaxed, low-defect SiGe alloy layer, i.e., layer 20, sandwiched between an insulating region, i.e., the barrier layer 12 and the thermal oxide 25, and surface oxide layer 22. See FIGS. 1D or 2D. The barrier layer 12 now includes an upper surface region that is rich in thermal oxide. The thermal oxide region is labeled as 25 in the drawings.

In accordance with the present invention, the relaxed SiGe layer 20 has a thickness of about 2000 nm or less, with a thickness of from about 10 to about 200 nm being more highly preferred. Note that the relaxed SiGe layer 20 formed in the present invention is thinner than prior art SiGe buffer layers and has a defect density including misfits and TDs, of less than about $10^8$ defects/cm$^2$.

The relaxed SiGe layer formed in the present invention has a final Ge content of from about 0.1 to about 99.9 atomic percent, with an atomic percent of Ge of from about 10 to about 35 being more highly preferred. Another characteristic feature of relaxed SiGe layer 22 is that it has a measured lattice relaxation of from about 1 to about 99%, with a measured lattice relaxation of from about 50 to about 80% being more highly preferred.

Figure 1E:
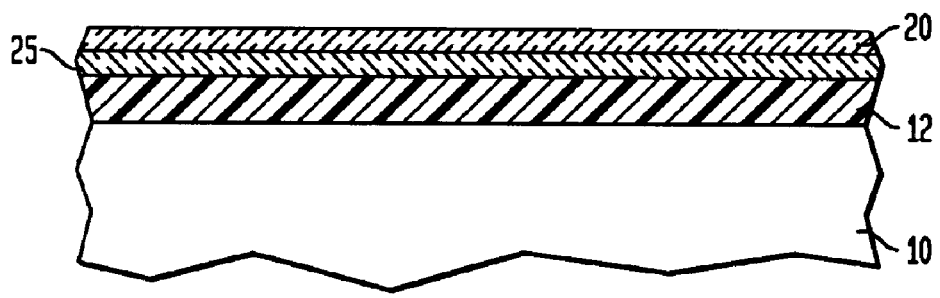
Figure 2E:
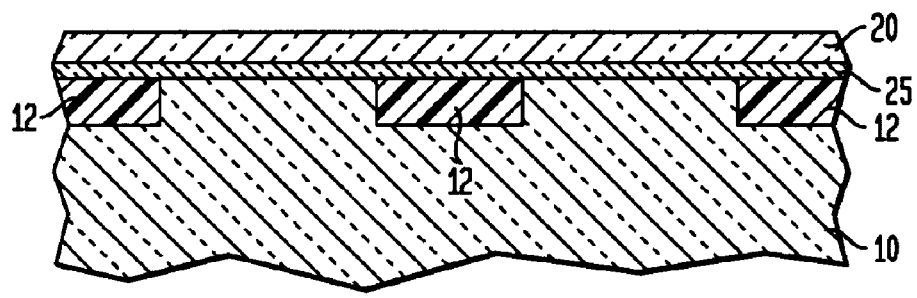

As stated above, the surface oxide layer 22 may be stripped at this point of the present invention so as to provide the SiGe-on-insulator substrate material shown, for example, in FIG. 1E or 2E (note that the substrate material does not include the cap layer since that layer has been used in forming the relaxed SiGe layer).

Figure 4A:
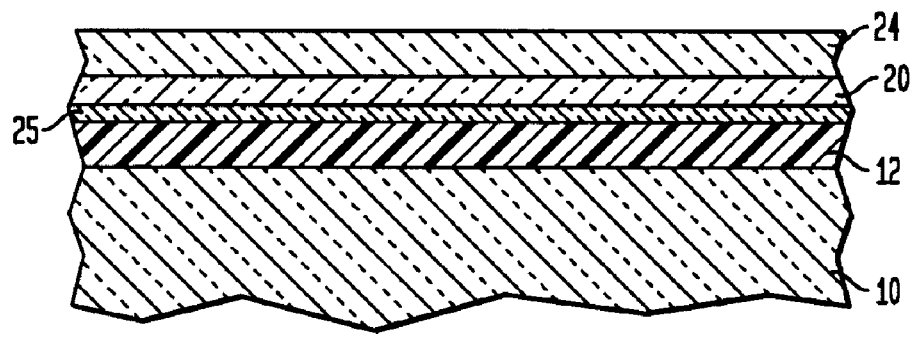
FIGS. 4A–4B are pictorial representations (through cross-sectional views) showing the formation of a strained Si layer on the thin, high-quality, substantially relaxed SiGe-on-insulator substrate material of FIGS. 1E and 2E, respectively.
Figure 4B:
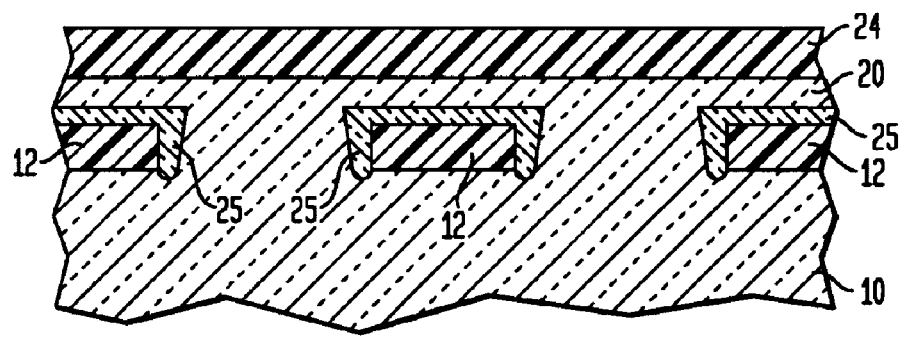

FIGS. 4A–B show the structure that is obtained after forming Si layer 24 atop SiGe layer of FIGS. 1E and 2E, respectively. Si layer 24 is formed using a conventional epitaxial deposition process well known in the art. The thickness of the epi-Si layer 24 may vary, but typically, the epi-Si layer 24 has a thickness of from about 1 to about 100 nm, with a thickness of from about 1 to about 50 nm being more highly preferred.

In some instances, additional SiGe or compressively strained pure Ge can be formed atop the relaxed SiGe layer 20 utilizing the above mentioned processing steps, and thereafter the epi-Si layer 24 may be formed. Because layer 20 has a large in-plane lattice parameter as compared to the epi-Si layer 24, epi-Si layer 24 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers of Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

In summary, the present invention provides a unique approach to the problem of forming high-quality, relaxed SiGe-on-insulator substrates for strained Si applications. The uniqueness lies in the combination of using a sacrificial layer as a sink for strain-relieving defects followed by consumption of the defective material by internal oxidation.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the letters patent is:

1. A method of producing a SiGe-on-insulator substrate material comprising:
    forming a strained Ge-containing layer on a surface of a sacrificial single crystal Si layer, said sacrificial single crystal Si layer is present atop a barrier layer that is resistant to Ge diffusion; and
    oxidizing said layers at a temperature that (i) homogenizes Ge atoms throughout the sacrificial single crystal Si layer and the Ge-containing layer, (ii) relaxes the Ge-containing layer by creating dislocations that are injected predominately into the sacrificial single crystal Si layer, and (ii) consumes the sacrificial single crystal Si layer by internal oxidation thereby forming a substantially relaxed, single crystal SiGe layer on a surface of a thermal oxide layer which also forms on said barrier layer during said oxidizing.

2. The method of claim 1 wherein said barrier layer is a patterned barrier layer.

3. The method of claim 1 wherein said barrier layer is an unpatterned barrier layer.

4. The method of claim 1 wherein said barrier layer comprises crystalline or non-crystalline oxides, or crystalline or non-crystalline nitrides.

5. The method of claim 1 wherein said baffler layer is a buried oxide region.

6. The method of claim 1 wherein said Ge-containing layer is a SiGe alloy or pure Ge.

7. The method of claim 6 wherein said Ge-containing layer is a SiGe alloy comprising up to 99.99 atomic percent Ge.

8. The method of claim 7 wherein said SiGe layer comprises from about 10 to about 35 atomic percent Ge.

9. The method of claim 1 wherein said Ge-containing layer is formed by an epitaxial growth process selected from the group consisting of rapid thermal chemical vapor deposition, low-pressure chemical vapor deposition, atmospheric pressure chemical vapor deposition, ultra-high vacuum chemical vapor deposition, molecular beam epitaxy, and plasma-enhanced chemical vapor deposition.

10. The method of claim 1 further comprising forming a Si cap layer atop said Ge-containing layer prior to oxidizing.

11. The method of claim 10 wherein said Si cap layer comprises epi-Si, a:Si, single or polycrystalline Si or any combination and multilayer thereof.

12. The method of claim 1 further comprising performing an implantation step prior to oxidizing, said implantation step includes ions that are capable of forming defects that allow enhanced relaxation at or near an interface between the sacrificial single crystal Si layer and the barrier layer.

13. The method of claim 1 further comprising performing an implantation step prior to oxidizing, said implantation step includes ions that are capable of amorphizing the sacrificial single crystal Si layer.

14. The method of claim 1 wherein a surface oxide layer is also formed during said oxidizing.

15. The method of claim 14 further comprising removing said surface oxide layer utilizing a wet chemical etch process.

16. The method of claim 1 wherein said oxidizing is carried out in an oxidizing ambient which comprises at least one oxygen-containing gas.

17. The method of claim 16 wherein said at least one oxygen-containing gas comprises $O_2$, NO, $N_2O$, ozone, air or mixtures thereof.

18. The method of claim 16 further comprising an inert gas, said inert gas being employed to dilute said at least one oxygen-containing gas.

19. The method of claim 1 wherein said temperature is from about 1200° C. to about 1350° C.

20. The method of claim 1 further comprising growing an additional SiGe layer atop said substantially relaxed SiGe layer.

21. The method of claim 20 further comprising forming a strained Si layer atop said additional SiGe layer.

22. The method of claim 1 further comprising forming a strained Si layer atop said substantially relaxed SiGe layer.

* * * * *